(12) United States Patent
Wu et al.

(10) Patent No.: US 11,582,872 B2
(45) Date of Patent: Feb. 14, 2023

(54) CIRCUIT BOARD

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Ke-Jian Wu, Shenzhen (CN); Fang-Bo Xu, Shenzhen (CN); Peng Wu, Shenzhen (CN); Jian-Quan Shen, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 891 days.

(21) Appl. No.: 16/433,594

(22) Filed: Jun. 6, 2019

(65) Prior Publication Data
US 2019/0289723 A1     Sep. 19, 2019

Related U.S. Application Data

(62) Division of application No. 15/636,790, filed on Jun. 29, 2017, now abandoned.

(30) Foreign Application Priority Data

Apr. 28, 2017   (CN) .......................... 201710297595.5

(51) Int. Cl.
*H05K 1/05* (2006.01)
*H05K 3/20* (2006.01)
(Continued)

(52) U.S. Cl.
CPC ............. *H05K 3/205* (2013.01); *H05K 1/056* (2013.01); *H05K 3/064* (2013.01); *H05K 3/181* (2013.01);
(Continued)

(58) Field of Classification Search
CPC ........ H05K 1/056; H05K 1/09; H05K 1/0284; H05K 1/0298; H05K 1/119; H05K 1/11;
(Continued)

(56) References Cited

U.S. PATENT DOCUMENTS 5,426,850 A * 6/1995 Fukutomi .............. H05K 3/428
                                                            29/847
5,647,966 A    7/1997 Uriu et al.
(Continued)

FOREIGN PATENT DOCUMENTS

CN        102196668 A      9/2011

*Primary Examiner* — Hoa C Nguyen
*Assistant Examiner* — John B Freal
(74) *Attorney, Agent, or Firm* — ScienBiziP, P.C.

(57) ABSTRACT

A circuit board with conductive wiring which is precisely shaped and sized includes a two-part conductive element, namely a first conductive wiring layer and a second conductive wiring layer, a first cover film and a second cover film. The first conductive wiring layer and the second conductive wiring layer are in direct contact to each other. A projection of the first conductive wiring layer and a projection of the second conductive wiring layer along a direction perpendicular to the circuit board overlap with each other. The first and the second cover films wrap the first and the second conductive wiring layers, respectively.

7 Claims, 7 Drawing Sheets

(51) Int. Cl.
*H05K 3/38* (2006.01)
*H05K 3/18* (2006.01)
*H05K 3/06* (2006.01)

(52) U.S. Cl.
CPC .............. *H05K 3/188* (2013.01); *H05K 3/385* (2013.01); *H05K 3/386* (2013.01); *H05K 2201/0141* (2013.01); *H05K 2201/0329* (2013.01); *H05K 2201/098* (2013.01)

(58) Field of Classification Search
CPC ............ H05K 1/18; H05K 2201/0141; H05K 2201/0145; H05K 2201/0329; H05K 2201/098; H05K 2201/0195; H05K 2201/0332; H05K 2201/0364; H05K 2201/0379; H05K 2201/09218; H05K 2201/09672; H05K 2201/09709; H05K 2201/09763

See application file for complete search history.

(56) References Cited

U.S. PATENT DOCUMENTS

| | | | |
|---|---|---|---|
| 6,579,660 | B1 | 6/2003 | Figov |
| 11,160,166 | B2* | 10/2021 | Xu .................. H05K 3/282 |
| 2003/0219608 | A1 | 11/2003 | Ishizaka et al. |
| 2006/0001173 | A1 | 1/2006 | Yamano et al. |
| 2007/0289127 | A1 | 12/2007 | Hurwitz et al. |
| 2008/0303146 | A1 | 12/2008 | Wang |
| 2009/0263748 | A1* | 10/2009 | Takemura ............. H05K 3/108 430/312 |
| 2011/0100952 | A1 | 5/2011 | Kim et al. |
| 2011/0240356 | A1* | 10/2011 | Wakita ................ H05K 3/4644 29/829 |
| 2013/0098665 | A1 | 4/2013 | Ishii et al. |
| 2016/0208143 | A1* | 7/2016 | Shim ................... H05K 3/4676 |

* cited by examiner

CIRCUIT BOARD

CROSS-REFERENCE TO RELATED APPLICATIONS

This is a divisional application of patent application Ser. No. 15/636,790, filed on Jun. 29, 2017, entitled "CIRCUIT BOARD AND METHOD FOR MANUFACTURING THE SAME", assigned to the same assignee, which is based on and claims priority to Chinese Patent Application No. 201710297595.5 filed on Apr. 28, 2017, the entire contents of which are incorporated by reference herein.

FIELD

The subject matter herein generally relates to a circuit board.

BACKGROUND

Circuit boards are widely used in various kinds of electronic devices. The circuit board may have a thick copper layer, which can provide an improved conductivity between electronic elements. However, a copper substrate needs to be etched for a long time to form the thick copper layer, which may also cause the copper substrate to be etched laterally. Thus, a line space and a line width of the thick copper layer need to be increased. However, the circuit board with a large line space and a large line width is not desirable. Improvement in the art is preferred.

BRIEF DESCRIPTION OF THE DRAWINGS

Implementations of the present technology will now be described, by way of example only, with reference to the attached figures.

DETAILED DESCRIPTION

Figure 1:
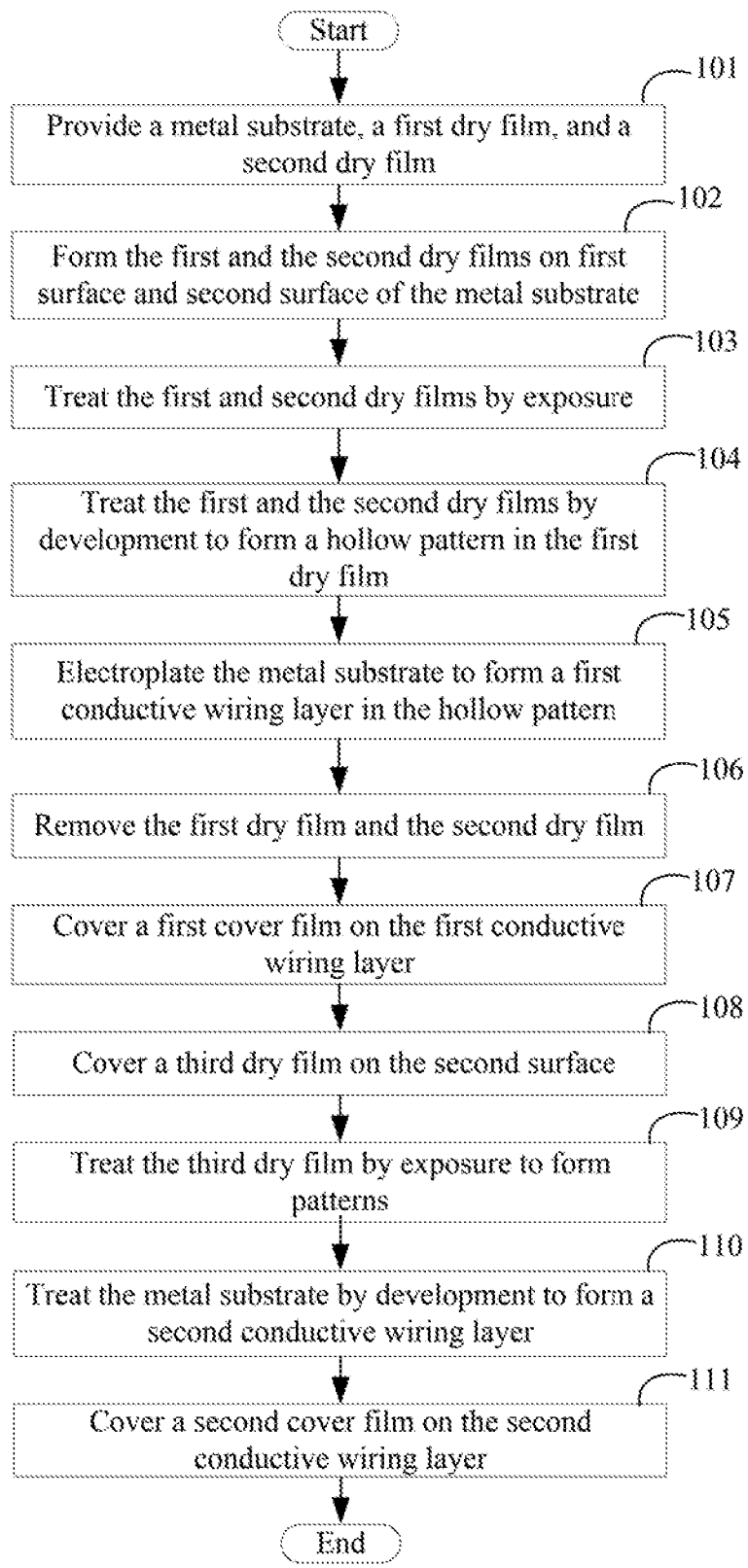
FIG. 1 is a flowchart of an exemplary embodiment of a method for manufacturing a circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Referring to FIG. 1, a method for manufacturing a circuit board 100 (see FIG. 12) is presented in accordance with an exemplary embodiment. The method for manufacturing the circuit board 100 is provided by way of example, as there are a variety of ways to carry out the method. The exemplary method can begin at block 201.

Figure 2:
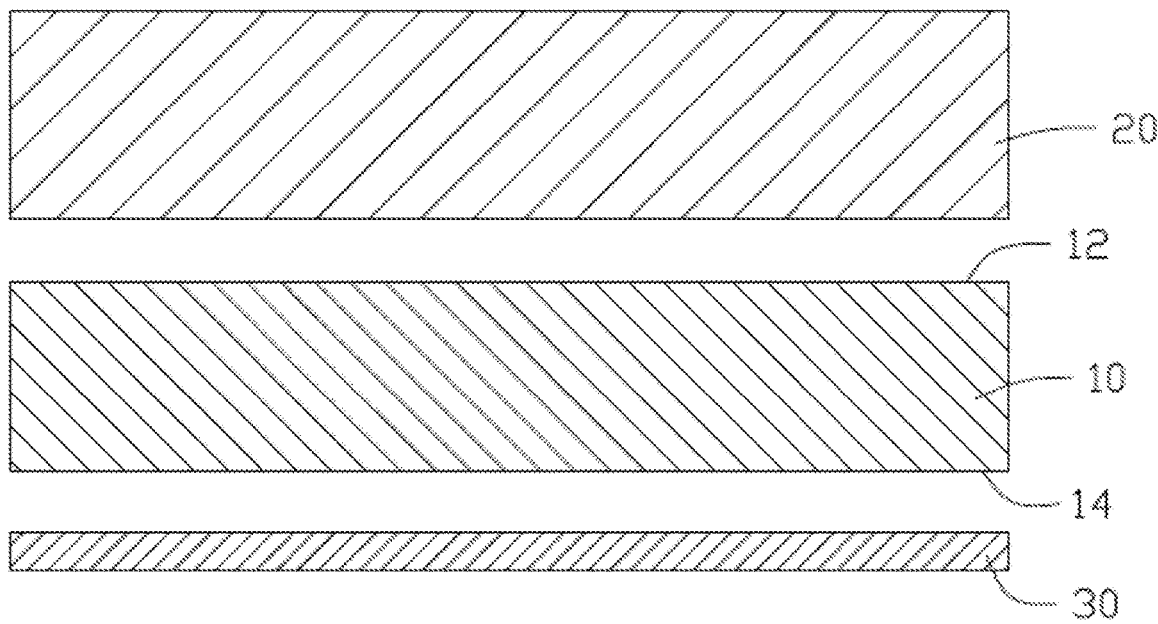
FIG. 2 is a diagram of a metal substrate, a first dry film, and a second dry film used in the method of FIG. 1.

At block 101, referring to FIG. 2, a metal substrate 10, a first dry film 20, and a second dry film 30 are provided. The metal substrate 10 comprises a first surface 12 and a second surface 14 facing away from the first surface 12.

In at least one exemplary embodiment, the metal substrate 10 is made of metal or metal alloy, and can be made by cutting a copper block. The metal substrate 10 has a thickness of about 50 µm to about 80 µm. In at least one exemplary embodiment, the metal substrate 10 has a thickness of about 70 µm.

In at least one exemplary embodiment, the first dry film 20 and the second dry film 30 have a similar structure. Each of the first dry film 20 and the second dry film 30 comprises a polyester layer, a photoresist layer, and a polyethylene layer (not shown) stacked together. The first dry film 20 has a thickness greater than a thickness of the second dry film 30. In at least one exemplary embodiment, the first dry film 20 has a thickness of about 75 µm. The second dry film 30 has a thickness of about 15 µm.

Figure 3:
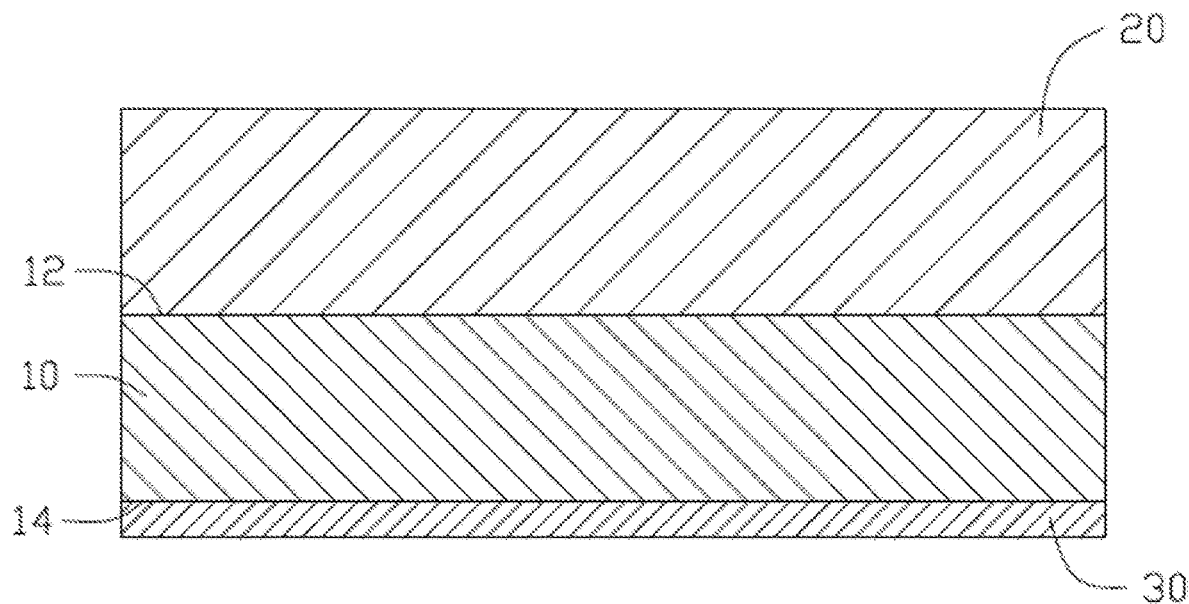
FIG. 3 is a diagram showing the first dry film and the second dry film being formed on the metal substrate of FIG. 2.

At block 102, referring to FIG. 3, the first dry film 20 and the second dry film 30 are respectively formed on the first surface 12 and the second surface 14.

Figure 4:
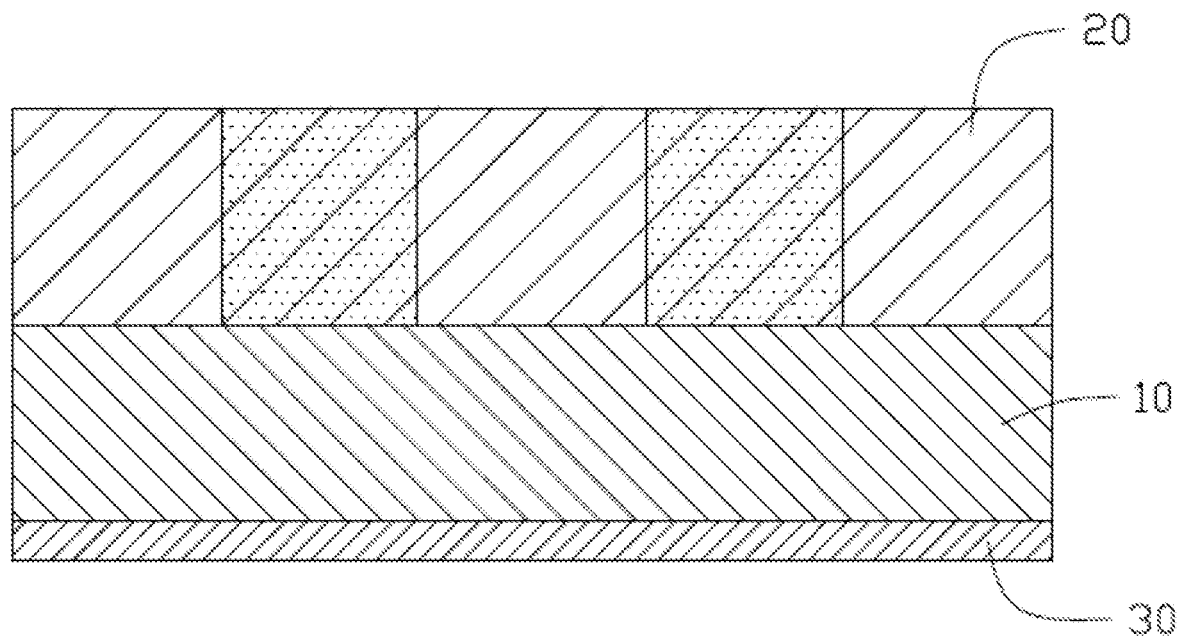
FIG. 4 is a diagram showing the first dry film and the second dry film of FIG. 3 being treated by an exposure process.

At block 103, referring to FIG. 4, the first dry film 20 and the second dry film 30 are treated by an exposure process.

In at least one exemplary embodiment, the exposure can be carried out by covering a photo mask (not shown) on the first dry film 20 facing away from the metal substrate 10, and exposing the first dry film 20 and the second dry film 30 to ultraviolet radiation, thereby causing the second dry film 30 and an uncovered portion of the first dry film 20 to be exposed under the ultraviolet radiation and be solidified.

Figure 5:
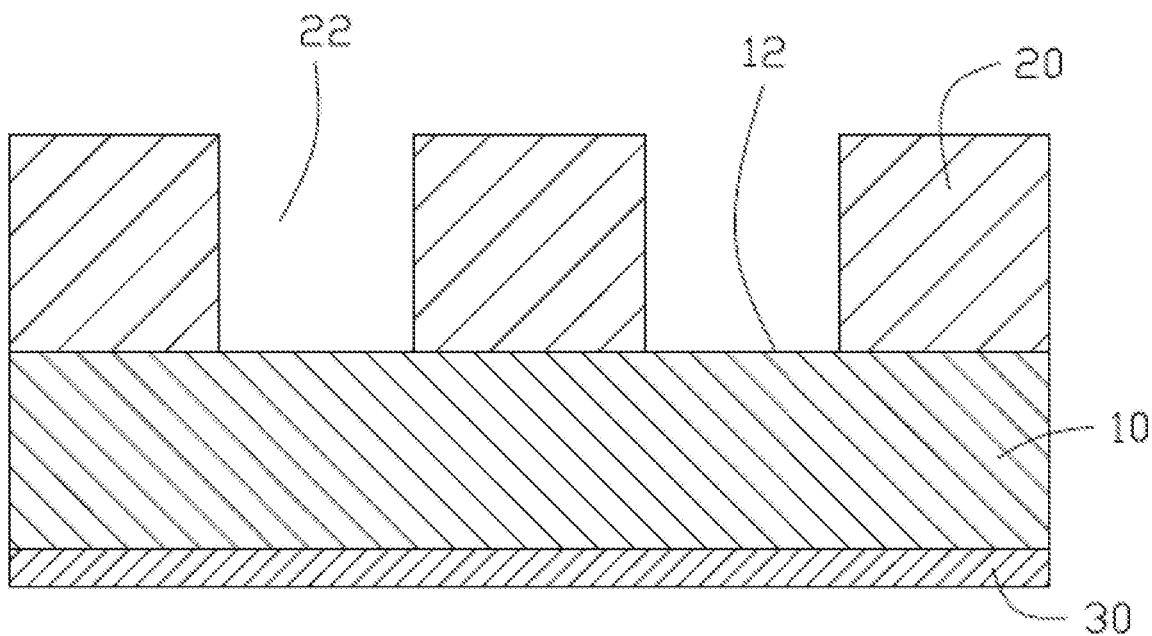
FIG. 5 is a diagram showing the first dry film of FIG. 4 being treated by a development process to form a hollow pattern.

At block 104, referring to FIG. 5, the first dry film 20 and the second dry film 30 after the exposure process are treated by a development process, thereby forming a hollow pattern 22 in the first dry film 20 towards the first surface 12.

In at least one exemplary embodiment, the development can be carried out by removing the photo mask, and etching a remaining portion of the first dry film 20 that is not exposed, thereby forming the hollow pattern 22 in the first dry film 20. In at least one exemplary embodiment, the first dry film 20 is etched by a sodium hydroxide solution having a mass concentration of about 1%.

Figure 6:
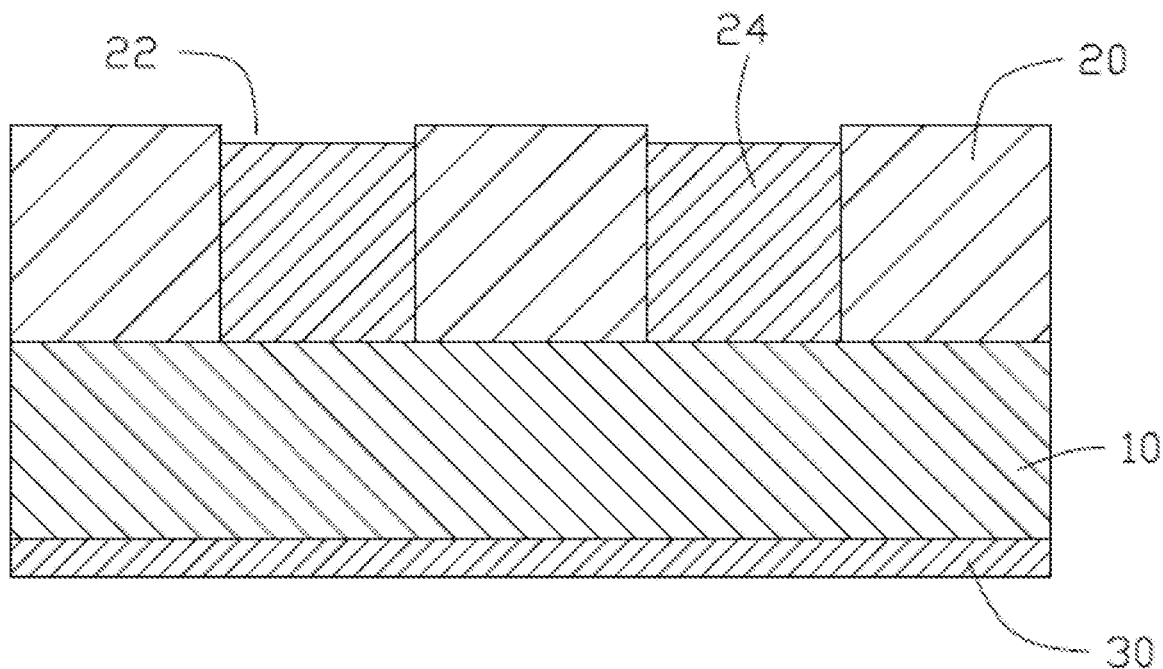
FIG. 6 is a diagram showing a first conductive wiring layer being formed in the hollow pattern of FIG. 5.

At block 105, referring to FIG. 6, the metal substrate 10 is electroplated to form a first conductive wiring layer 24 in the hollow pattern 22.

In at least one exemplary embodiment, the first conductive wiring layer 24 has a thickness of about 60 μm to about 70 μm. The electroplating can be panel plating that does not require any lead wire and has a simplified process.

Figure 7:
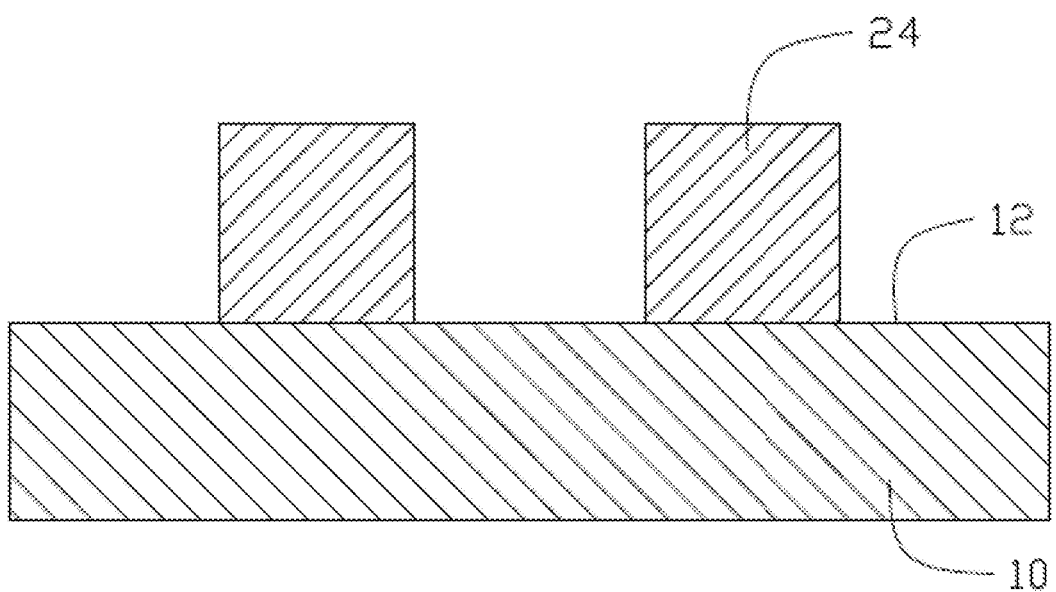
FIG. 7 is a diagram showing the first dry film and the second dry film of FIG. 6 being removed.

At block 106, referring to FIG. 7, the first dry film 20 and the second dry film 30 are removed, thereby exposing a remaining portion of the first surface 12.

The cross-sectional shape of the first conductive wiring layer 24 can be varied as needed. In at least one exemplary embodiment, the cross-sectional shape of the first conductive wiring layer 24 is substantially rectangular.

Figure 8:
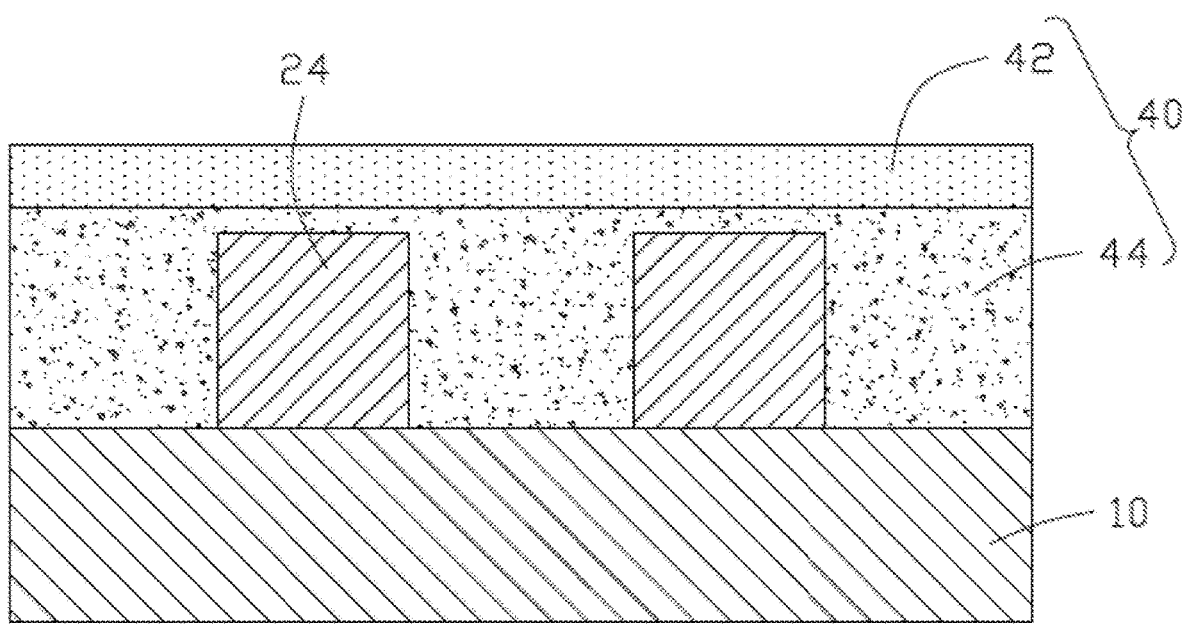
FIG. 8 is a diagram showing a first cover film being formed on the first conductive wiring layer of FIG. 7.

At block 107, referring to FIG. 8, a first cover film 40 is covered on and fills in gaps of the first conductive wiring layer 24. The first cover film 40 wraps the top surface away from the metal substrate 10 and the sidewalls of the first conductive wiring layer 24.

In at least one exemplary embodiment, the first cover film 40 comprises a first cover layer 42 and a first adhesive layer 44 connected to the first cover layer 42. The first adhesive layer 44 is between the first cover layer 42 and the first conductive wiring layer 24 and fills in gaps of the first conductive wiring layer 24. The first adhesive layer 44 wraps the top surface and the sidewalls of the first conductive wiring layer 24. The first cover film 40 can be made of liquid crystal polymer (LCP).

Figure 9:
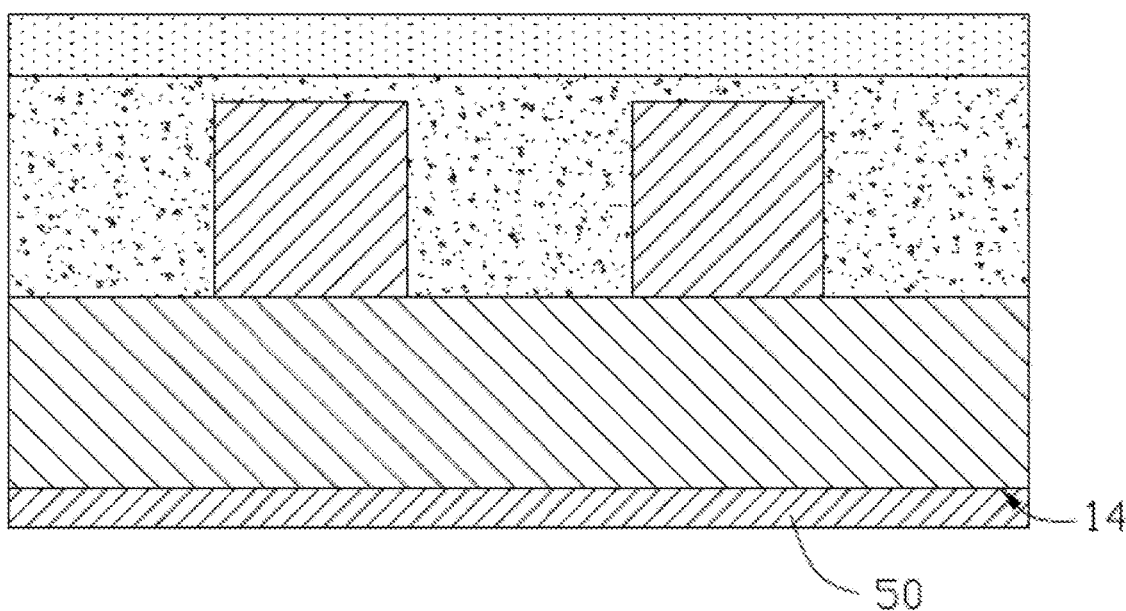
FIG. 9 is a diagram showing a third dry film being formed on the metal substrate of FIG. 8.

At block 108, referring to FIG. 9, a third dry film 50 is covered on the second surface 14.

The third dry film 50 can have a similar structure as the first dry film 20 and the second dry film 30. In at least one exemplary embodiment, the third dry film 50 has a thickness the same as that of the second dry film 30.

Figure 10:
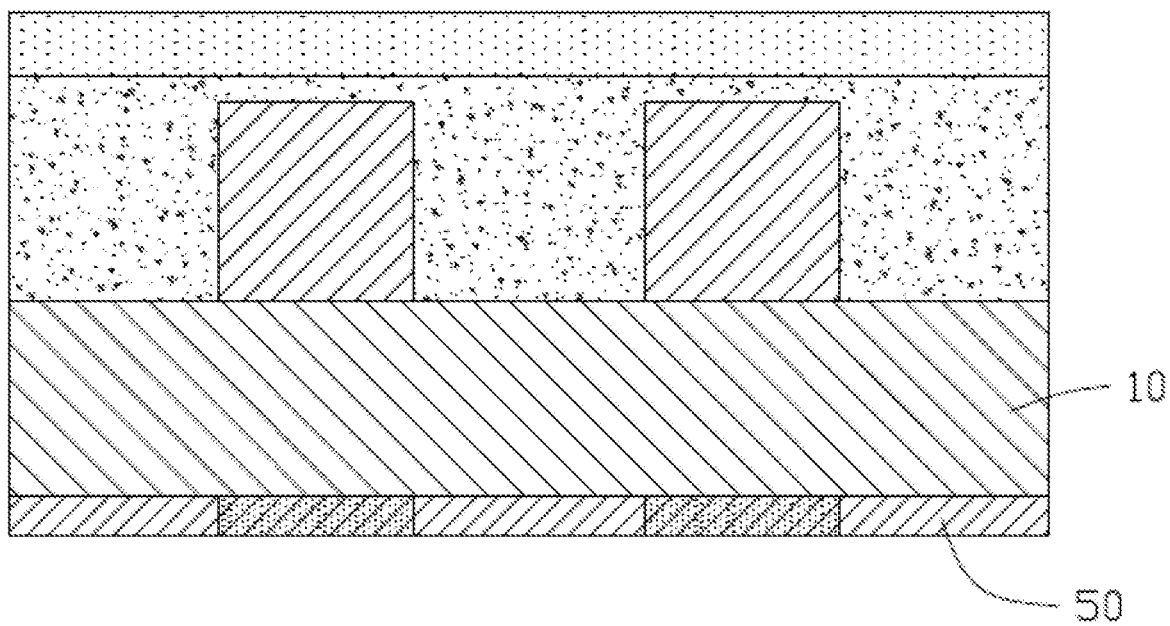
FIG. 10 is a diagram showing third dry film of FIG. 9 being treated by an exposure process.

At block 109, referring to FIG. 10, the third dry film 50 is treated by an exposure process to form patterns corresponding to the first conductive wiring layer 24.

Figure 11:
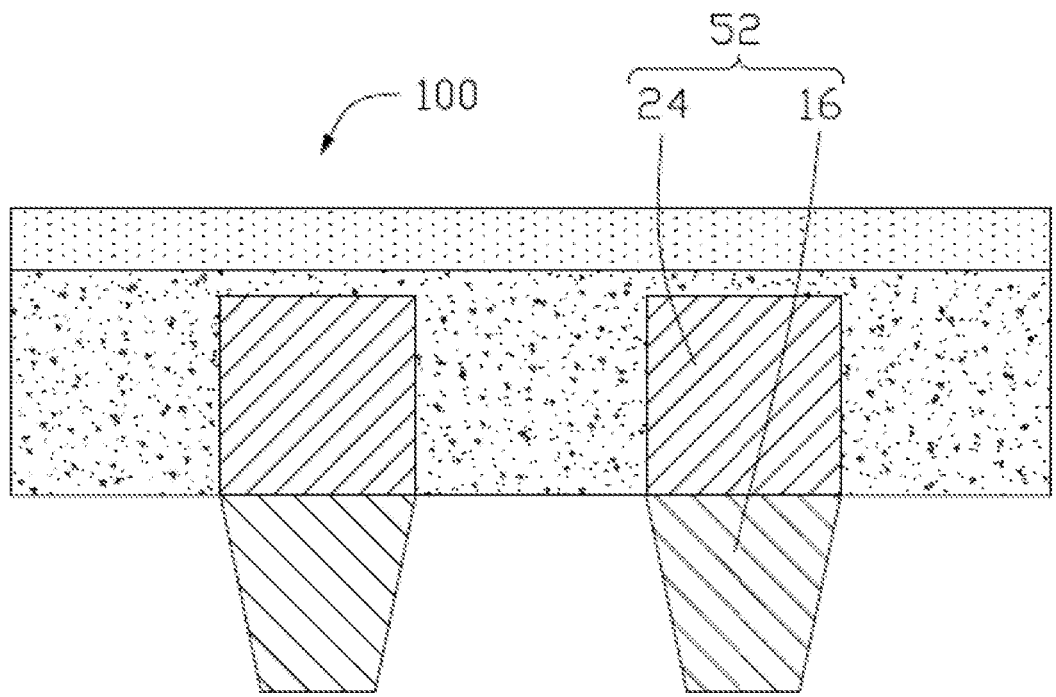
FIG. 11 is a diagram showing a second conductive wiring layer being formed on the third dry film of FIG. 10.

At block 110, referring to FIG. 11, the metal substrate 10 is treated by a development process through the patterned third dry film 50, thereby completely etching a portion of the metal substrate 10 from the second surface 14 to the first surface 12, to form a second conductive wiring layer 16. Then the third dry film 50 is removed.

The second conductive wiring layer 16 is directly and electrically connected to the first conductive wiring layer 24. A projection of the first conductive wiring layer 24 and a projection of the second conductive wiring layer 16 along a direction perpendicular to the circuit board 100 totally overlap with each other. The first conductive wiring layer 24 and the second conductive wiring layer 16 cooperatively form a conductive wiring 52. In at least one exemplary embodiment, the second conductive wiring layer 16 has a thickness of about 70 μm. A cross-sectional shape of the second conductive wiring layer 16 is substantially trapezoidal.

Figure 12:
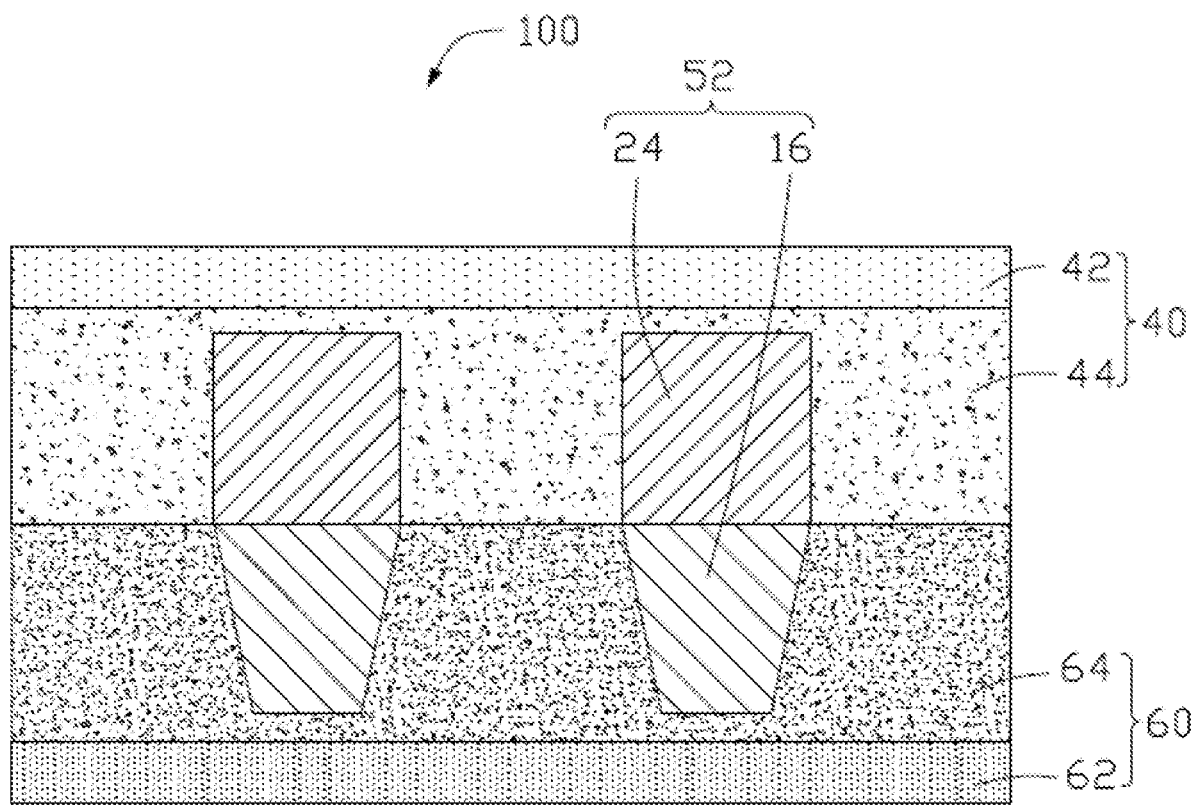
FIG. 12 is a diagram showing a second cover film being formed on the second conductive wiring layer of FIG. 11 to form a circuit board.

At block 111, referring to FIG. 12, a second cover film 60 is covered on and fills in gaps of the second conductive wiring layer 16, thereby forming the circuit board 100. The second cover film 60 wraps the top surface away from the first conductive wiring layer 24 and the sidewalls of the second conductive wiring layer 16.

In at least one exemplary embodiment, the second cover film 60 comprises a second cover layer 62 and a second adhesive layer 64 connected to the second cover layer 62. The second adhesive layer 64 is positioned between the second cover layer 62 and the second conductive wiring layer 16 and fills in gaps of the second conductive wiring layer 16. The second adhesive layer 64 wraps the top surface and the sidewalls of the second conductive wiring layer 16. The second cover film 60 can be made of a material the same as that of the first cover film 40.

In other exemplary embodiments, the first dry film 20, the second dry film 30, and the third dry film 50 can be replaced by liquid photo resist films or fiber resin films, which are made of a photoresisting material.

Referring to FIG. 12, the circuit board 11 comprises conductive wiring 52. The conductive wiring 52 comprises a first conductive wiring layer 24 and a second conductive wiring layer 16. The first conductive wiring layer 24 is formed by electroplating. The second conductive wiring layer 16 is formed by etching a metal substrate 10. The first conductive wiring layer 24 and the second conductive wiring layer 16 are in direct contact and electrically connected to each other. A projection of the first conductive wiring layer 24 and a projection of the second conductive wiring layer 16 along a direction perpendicular to the circuit board 100 totally overlap with each other.

The circuit board 100 further comprises a first cover film 40 covering and filling in gaps of the first conductive wiring layer 24, and a second cover film 60 covering and filling in gaps of the second conductive wiring layer 16.

With the above configuration, the second conductive wiring layer 16 is directly formed by etching the metal substrate 10 having a suitable thickness, thereby avoiding under etching during the etching process. Furthermore, the first conductive wiring layer 24 and the second conductive wiring layer 16 are in direct contact and electrically connected to each other to form the conductive wiring 52. A projection of the first conductive wiring layer 24 and a projection of the second conductive wiring layer 16 along a direction perpendicular to the circuit board 100 overlap with each other. Thus, a line space and a line width of the conductive wiring 52 can be decreased.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A circuit board comprising:
   a conductive wiring comprising:
      a first conductive wiring layer; and
      a second conductive wiring layer, wherein the first conductive wiring layer and the second conductive wiring layer are in direct contact to each other, a projection of the first conductive wiring layer and a projection of the second conductive wiring layer along a direction perpendicular to the circuit board overlap with each other, a cross-sectional shape of the second conductive wiring layer is trapezoidal;
   a first cover film covering the first conductive wiring layer, the first cover film wrapping a top surface of the first conductive wiring layer away from the second conductive wiring layer and sidewalls of the first conductive wiring layer; and
   a second cover film covering the second conductive wiring layer, the second cover film wrapping a top surface of the second conductive wiring layer away from the first conductive wiring layer and sidewalls of the second conductive wiring layer;

wherein the first cover film comprises a first cover layer and a first adhesive layer connected to the first cover layer, and the first adhesive layer is between the first cover layer and the first conductive wiring layer and wraps the top surface and the sidewalls of the first conductive wiring layer.

2. The circuit board of claim 1, wherein the first cover film is made of liquid crystal polymer.

3. The circuit board of claim 1, wherein the second cover film comprises a second cover layer and a second adhesive layer connected to the second cover layer, the second adhesive layer is positioned between the second cover layer and the second conductive wiring layer and wraps the top surface and the sidewalls of the second conductive wiring layer.

4. The circuit board of claim 1, wherein the second cover film is made of liquid crystal polymer.

5. The circuit board of claim 1, wherein the first conductive wiring layer has a thickness of 60 μm to 70 μm.

6. The circuit board of claim 1, wherein a cross-sectional shape of the first conductive wiring layer is rectangular.

7. The circuit board of claim 1, wherein the second conductive wiring layer has a thickness of 70 μm.

* * * * *